United States Patent
Yoshida

(10) Patent No.: US 9,340,005 B2
(45) Date of Patent: May 17, 2016

(54) GRAVURE PRINTING PLATE AND MANUFACTURING METHOD THEREOF, GRAVURE PRINTING MACHINE, AND MANUFACTURING METHOD FOR LAMINATED CERAMIC ELECTRONIC COMPONENT

(71) Applicant: MURATA MANUFACTURING CO., LTD., Kyoto-fu (KR)

(72) Inventor: Kazuhiro Yoshida, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/506,993

(22) Filed: Oct. 6, 2014

(65) Prior Publication Data

US 2015/0107473 A1    Apr. 23, 2015

(30) Foreign Application Priority Data

Oct. 22, 2013    (JP) ................................ 2013-219099

(51) Int. Cl.
| | |
|---|---|
| B41F 13/11 | (2006.01) |
| B41C 1/00 | (2006.01) |
| B41N 1/06 | (2006.01) |
| B41N 1/20 | (2006.01) |
| H05K 3/12 | (2006.01) |
| B41M 1/10 | (2006.01) |
| B41C 1/18 | (2006.01) |

(52) U.S. Cl.
CPC ... *B41C 1/00* (2013.01); *B41N 1/06* (2013.01); *B41N 1/20* (2013.01); *H05K 3/1275* (2013.01); *B41C 1/188* (2013.01); *B41F 13/11* (2013.01); *B41M 1/10* (2013.01); *H05K 2203/0134* (2013.01); *Y10T 156/10* (2015.01)

(58) Field of Classification Search
None
See application file for complete search history.

(56) References Cited

U.S. PATENT DOCUMENTS

| | | | |
|---|---|---|---|
| 2,322,530 A | * | 6/1943 | MacArthur ..................... 492/31 |
| 2,431,710 A | * | 12/1947 | Schultz et al. ............. 101/401.1 |
| 4,187,107 A | | 2/1980 | Homma et al. |

(Continued)

FOREIGN PATENT DOCUMENTS

| | | |
|---|---|---|
| JP | H06-316174 A | 11/1994 |
| JP | H11-042764 A | 2/1999 |

(Continued)

OTHER PUBLICATIONS

An Office Action; "Notice of Reasons for Rejection," issued by the Japanese Patent Office on Oct. 27, 2015, which corresponds to Japanese Patent Application No. 2013-219099 and is related to U.S. Appl. No. 14/506,993; with English language translation.

*Primary Examiner* — Jill Culler
(74) *Attorney, Agent, or Firm* — Studebaker & Brackett PC

(57) ABSTRACT

Banks, as well as a plurality of recess-shaped cells defined by the banks, are provided in an image section formed in a gravure printing plate. A projecting portion is provided in each of the cells so as to protrude from a part of the base surface of that cell. The projecting portions are in positions distanced from the banks. Like the banks, the projecting portions can serve as starting points for the transfer of a printing paste. Accordingly, printing paste that would, in the case where the projecting portions are not provided, remain in the bases of the cells is transferred to the printing target material via the projecting portions, which increases the transfer efficiency. As a result, a paste film that is smooth and has the required thickness can be printed.

8 Claims, 19 Drawing Sheets

(56) References Cited

U.S. PATENT DOCUMENTS

| | | | |
|---|---|---|---|
| 5,033,377 A * | 7/1991 | Shimizu | 101/150 |
| 5,656,081 A | 8/1997 | Isen et al. | |
| 6,010,771 A | 1/2000 | Isen et al. | |
| 6,907,826 B1 * | 6/2005 | Berg et al. | 101/424 |
| 7,063,014 B2 * | 6/2006 | Hashimoto et al. | 101/150 |
| 7,481,162 B2 * | 1/2009 | Takashima et al. | 101/150 |
| 2003/0111158 A1 * | 6/2003 | Okuyama et al. | 156/89.12 |
| 2011/0068509 A1 * | 3/2011 | Perrier | 264/400 |
| 2011/0146515 A1 | 6/2011 | Lee et al. | |

FOREIGN PATENT DOCUMENTS

| | | |
|---|---|---|
| JP | 2003-209025 A | 7/2003 |
| JP | 2006-051721 A | 2/2006 |
| JP | 2006-110916 A | 4/2006 |
| JP | 2012-056143 A | 3/2012 |
| WO | WO 2012114279 A1 * | 8/2012 |

* cited by examiner

GRAVURE PRINTING PLATE AND MANUFACTURING METHOD THEREOF, GRAVURE PRINTING MACHINE, AND MANUFACTURING METHOD FOR LAMINATED CERAMIC ELECTRONIC COMPONENT

CROSS REFERENCE TO RELATED APPLICATIONS

This application claims benefit of priority to Japanese Patent Application No. 2013-219099 filed Oct. 22, 2013, the entire content of which is incorporated herein by reference.

TECHNICAL FIELD

The present technical field relates to gravure printing plates and manufacturing methods thereof, gravure printing machines, and manufacturing methods for laminated ceramic electronic components carried out using gravure printing machines, and particularly relates to techniques for increasing the smoothness and uniformity of thickness of a paste film formed through gravure printing.

BACKGROUND

To manufacture laminated ceramic electronic components such as laminated ceramic capacitors, a process is carried out for applying a conductive paste, which will serve as a conductor film such as an internal electrode, onto a ceramic green sheet, for example. Gravure printing is applied in this process, for example.

When printing a conductor film using a conductive paste, it is necessary to apply fine metal particles serving as a conductive material in a uniform manner and with a certain thickness. As such, compared to color printing of printed materials, film materials for wrapping, and the like, a larger printed film thickness is required, and there is demand for the conductor film to be highly smooth while at the same time ensuring the required paste film thickness.

For example, Japanese Unexamined Patent Application Publication No. 2012-56143 discloses a gravure printing plate including an intermediate step portion, provided in each of cells, that is lower than a first bank and a second bank but is higher than a deep portion, toward the front of a printing direction. Providing the intermediate step portion in this manner reduces variations in the depth dimension near the banks. This in turn reduces a drop in pressure, which suppresses transfer unevenness and by extension increases the smoothness of the surface of a paste film.

However, although the method disclosed in Japanese Unexamined Patent Application Publication No. 2012-56143 does of course increase the smoothness, the method also causes the volume of the cells to drop in the vicinity of the banks, which reduces the thickness of the paste film. Meanwhile, the transferability will worsen in the central areas of the cells, causing a drop in the paste film thickness. There are thus cases where the required thickness cannot be ensured in the printed paste film.

To illustrate the aforementioned poor transferability of the printing paste in the central areas of the cells in particular, the behavior of the printing paste with which the cells are filled when the paste is transferred onto a printing target material during gravure printing will be described with reference to FIGS. 18 to 21. FIGS. 18 to 21 illustrate cross-sectional views of a gravure printing plate 4, having an image section 3, in which banks 1 and cells 2 defined by the banks 1 are provided. This gravure printing plate 4 transfers a conductive paste film 7 onto a ceramic green sheet 6 that is backed by a carrier film 5, serving as a printing target material.

First, as shown in FIG. 18, the cells 2 are filled with a conductive paste 8 serving as a printing paste.

Next, as shown in FIG. 19, the ceramic green sheet 6 that is backed by the carrier film 5 is placed into contact with the image section 3 of the gravure printing plate 4. At this time, the conductive paste 8 adheres to the ceramic green sheet 6 while flowing in the directions indicated by arrows 9. Small air pockets 10 are formed in the conductive paste 8 as well.

Thereafter, the ceramic green sheet 6 is separated from the gravure printing plate 4. FIG. 20 illustrates a state when the ceramic green sheet 6 begins to separate from the gravure printing plate 4. As shown in FIG. 20, the conductive paste 8 begins to be transferred onto the ceramic green sheet 6 from the banks 1 while flowing along the banks 1 in the directions indicated by arrows 11.

Next, FIG. 21 illustrates a state when the ceramic green sheet 6 is further separated from the gravure printing plate 4 and the transfer of the conductive paste 8 has ended. As shown in FIG. 21, the conductive paste film 7 is formed on the ceramic green sheet 6.

The conductive paste 8 inevitably remains in the central areas of the cells 2, as can be seen in FIG. 21. Meanwhile, with respect to the conductive paste film 7 on the ceramic green sheet 6, surface tension acting in the conductive paste itself causes the conductive paste to flow in the direction of arrows 12 after the conductive paste has been transferred starting from the banks 1, and the conductive paste attempts to take on a uniform thickness. However, the conductive paste is thicker than other printing pastes, and there is thus a limit on how uniform the thickness of the conductive paste film 7 can become. As a result, the conductive paste film 7 tends to be thicker in areas corresponding to the banks 1 and thinner in areas corresponding to the centers of the cells 2.

The aforementioned phenomenon in which the transferability is poor in the centers of the cells 2 is caused by the conductive paste 8 remaining in the centers of the cells 2, as well as the difficulty in correcting non-uniform thicknesses in the conductive paste film 7 caused by the transfer of the conductive paste 8 starting from the banks 1, as described above.

The following can be considered as methods for increasing the film thickness in the centers of the cells.

(1) A method that increases the volume of the printing paste with which each cell is filled by making the cells deeper can be considered. However, deepening the cells reduces the accuracy in which the cell shapes are formed. Furthermore, deepening the cells will only increase the amount of printing paste that remains in the bases of the cells and is not transferred, and thus there will often not be enough printing paste to ensure the required film thickness.

(2) A method that increases the volume of the printing paste with which each cell is filled by widening the area of the cell openings can be considered. However, because the transfer of the printing paste starts from the banks, it is easier for the paste film to become thinner as the cell progresses further from the banks, which can result in the smoothness worsening.

In this manner, it is not particularly easy to form a paste film that is both smooth and has the necessary film thickness through gravure printing.

SUMMARY

Accordingly, it is an object of the present disclosure to provide a gravure printing plate, and a manufacturing method thereof, capable of printing a paste film that is both smooth and has a required film thickness.

It is another object of the present disclosure to provide a gravure printing machine that includes the aforementioned gravure printing plate.

It is yet another object of the present disclosure to provide a manufacturing method for a laminated ceramic electronic component that is executed using the aforementioned gravure printing machine.

The present disclosure is directed at a gravure printing plate used for transferring a paste film onto a printing target material through gravure printing. The gravure printing plate includes an image section to which a printing paste for forming the paste film is supplied, and the image section is provided with banks and a plurality of recess-shaped cells defined by the banks.

To solve the aforementioned technical problem, in this gravure printing plate, the image section is further provided with projecting portions that project from a part of a bottom surface of each cell inside of the cell and that are separated from the banks, in addition to the aforementioned banks and cells.

Like the banks, the projecting portions can serve as starting points for the transfer. Accordingly, printing paste that would, in the case where the projecting portions are not provided, remain in the bases of the cells is transferred to the printing target material via the projecting portions, which increases the transfer efficiency. This contributes to solving the problem of poor transferability in central areas of the cells.

It is preferable that each projecting portion is positioned in a central area of the corresponding cell. Doing so makes it possible to obtain a smoother paste film.

In the gravure printing plate according to an aspect of the present disclosure, it is preferable that the plurality of cells are classified into edge cells located along an outer edge of the image section and center cells that are the remaining cells, that the projecting portions are provided in the edge cells and the center cells, and that the projecting portions provided in the edge cells are each positioned closer to the outer edge than to the nearest bank.

It is preferable that there are provided two or more projecting portions in each cell. In this case, a reduction in the amount of paste with which each cell is filled can be suppressed by making each projecting portion smaller. It is thus possible to obtain a smoother paste film while ensuring the required film thickness with certainty.

It is preferable that, in both the cells and the projecting portions, a dimension measured along a printing direction is different from a dimension measured along a direction orthogonal to the printing direction, and that the direction having the longer dimension of these dimensions is the same in both the cells and the projecting portions. According to this configuration, a highly-smooth paste film can be obtained with more certainty.

It is preferable that the cells and the projecting portions in the cells have at least one axis of symmetry relative to which the cells and the projecting portions are linearly symmetrical. This configuration contributes to increasing the smoothness of the paste film.

It is preferable that a height of the projecting portions is lower than a height of the banks.

It is preferable that the projecting portions occupy no greater than approximately 5% of the area of an opening of the corresponding cell. This is to prevent a drastic reduction in the amount of paste with which the cells are filled.

It is preferable that the cells have substantially polygonal shapes.

According to an aspect of the present disclosure, it is preferable that the gravure printing plate is a substantially cylindrical-shaped gravure cylinder and the image section is formed on an outer circumferential surface thereof.

The present disclosure is also directed at a gravure printing machine including the aforementioned gravure printing plate.

Furthermore, the present disclosure is also directed at a manufacturing method for a laminated ceramic electronic component that is executed using the aforementioned gravure printing machine. In the manufacturing method for a laminated ceramic electronic component according to the present disclosure, the method uses a conductive paste as the printing paste and uses the aforementioned gravure printing machine to carry out the steps of forming, as the paste film, a conductive paste film that is to serve as an internal electrode, on the ceramic green sheet that serves as a printing target material, and creating a multilayer body by stacking a plurality of the ceramic green sheets on which the conductive paste film has been formed.

Further still, the present disclosure is also directed at a method for manufacturing the aforementioned gravure printing plate. A manufacturing method for the gravure printing plate according to the present disclosure includes the steps of preparing a base member configured of a metal, forming a plating layer on the base member, and forming the image section in which the banks, the cells, and the projecting portions are provided, by partially removing an outer surface of the plating layer.

In the manufacturing method for the gravure printing plate according to an aspect of the present disclosure, it is preferable that the step of forming the image section includes a step of partially removing the outer surface of the plating layer through chemical etching.

As described above, according to the gravure printing plate of the present disclosure, the projecting portions that project from a part of a base surface of each cell inside of the cell and that are separated from the banks are provided. Accordingly, the projecting portions serve as starting points for the transfer of the printing paste, which makes it possible to increase the transfer efficiency of the printing paste within the cells. Accordingly, the printed paste film can be provided with the necessary film thickness, and the smoothness of the paste film can be increased.

Other features, elements, characteristics and advantages of the present disclosure will become more apparent from the following detailed description of preferred embodiments of the present disclosure with reference to the attached drawings.

DETAILED DESCRIPTION

Figure 1:
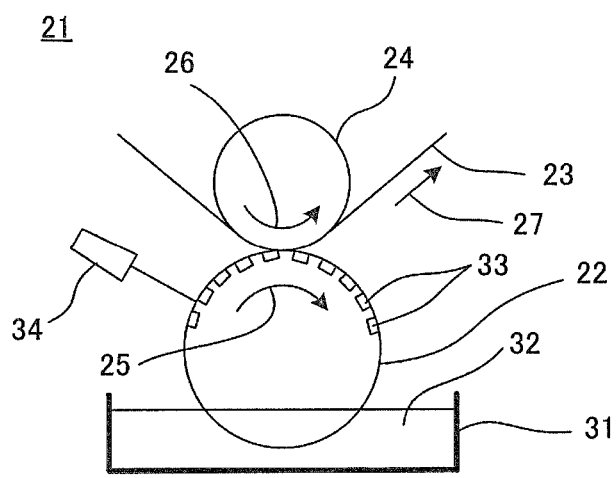
FIG. 1 is a side view schematically illustrating a gravure printing machine including a gravure cylinder serving as a gravure printing plate according to the present disclosure.

An overview of a gravure printing machine 21 including a gravure cylinder 22 that serves as a gravure printing plate according to the present disclosure will be described with reference to FIG. 1.

The gravure printing machine 21 includes the gravure cylinder 22 and an impression cylinder 24 that opposes the gravure cylinder 22 with a substantially sheet-shaped printing target material 23 provided therebetween. The gravure cylinder 22 and the impression cylinder 24 rotate in the directions indicated by arrows 25 and 26, respectively, and the printing target material 23 is transported in the direction indicated by an arrow 27 as a result. Note that a gravure printing machine that does not include an impression cylinder, such as a gravure planographic printing machine, is also possible.

The gravure printing machine 21 is used for the manufacture of laminated ceramic electronic components such as laminated ceramic capacitors, for example. More specifically, the gravure printing machine 21 is used to form a paste film, which is to serve as a layer that is patterned as part of a layered structure provided in the laminated ceramic electronic component, on the printing target material 23 through gravure printing. Even more specifically, a conductive paste film 29 to serve as a patterned internal electrode is formed on a ceramic green sheet 28 through gravure printing, as shown in FIG. 2.

Figure 2:
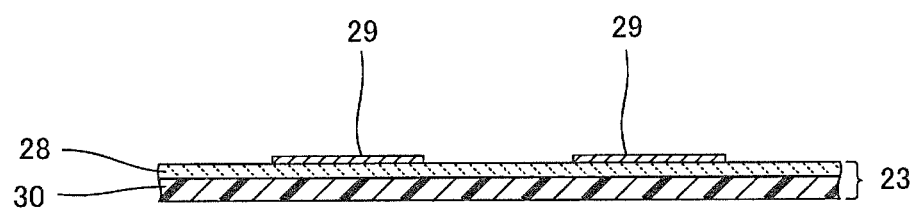
FIG. 2 is a cross-sectional view illustrating a state in which a conductive paste film is formed, by the gravure printing machine shown in FIG. 1, on a ceramic green sheet backed by a carrier film, serving as a printing target material.

The ceramic green sheet 28 is backed by a carrier film 30, as shown in FIG. 2. Accordingly, the printing target material 23 shown in FIG. 1 is the ceramic green sheet 28 that is backed by the carrier film 30 in this manner.

The gravure cylinder 22 is, as shown in FIG. 1, immersed in a conductive paste 32 held in a tank 31, and as a result applies the conductive paste 32 to a plurality of image sections 33 (only some of which are schematically shown) formed on the circumferential surface of the gravure cylinder 22. Details of the image sections 33 will be given later. Note that the conductive paste 32 may be supplied to the gravure cylinder 22 through a method such as ejecting the conductive paste 32 toward the gravure cylinder 22. Extra conductive paste 32 on the circumferential surface of the gravure cylinder 22 is wiped off by a doctor blade 34.

Figure 3:
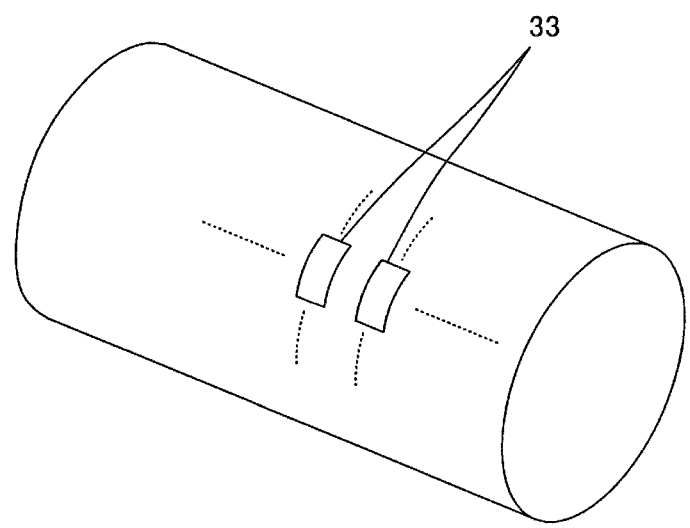
FIG. 3 is a perspective view illustrating the gravure cylinder shown in FIG. 1 alone.

The image sections 33, as schematically illustrated in FIG. 3 where only a representative example of the image sections 33 is shown, have a pattern corresponding to the pattern of the conductive paste film 29 shown in FIG. 2. In this embodiment, a lengthwise direction of the image sections 33 follows a circumferential direction of the gravure cylinder 22.

Figure 4:
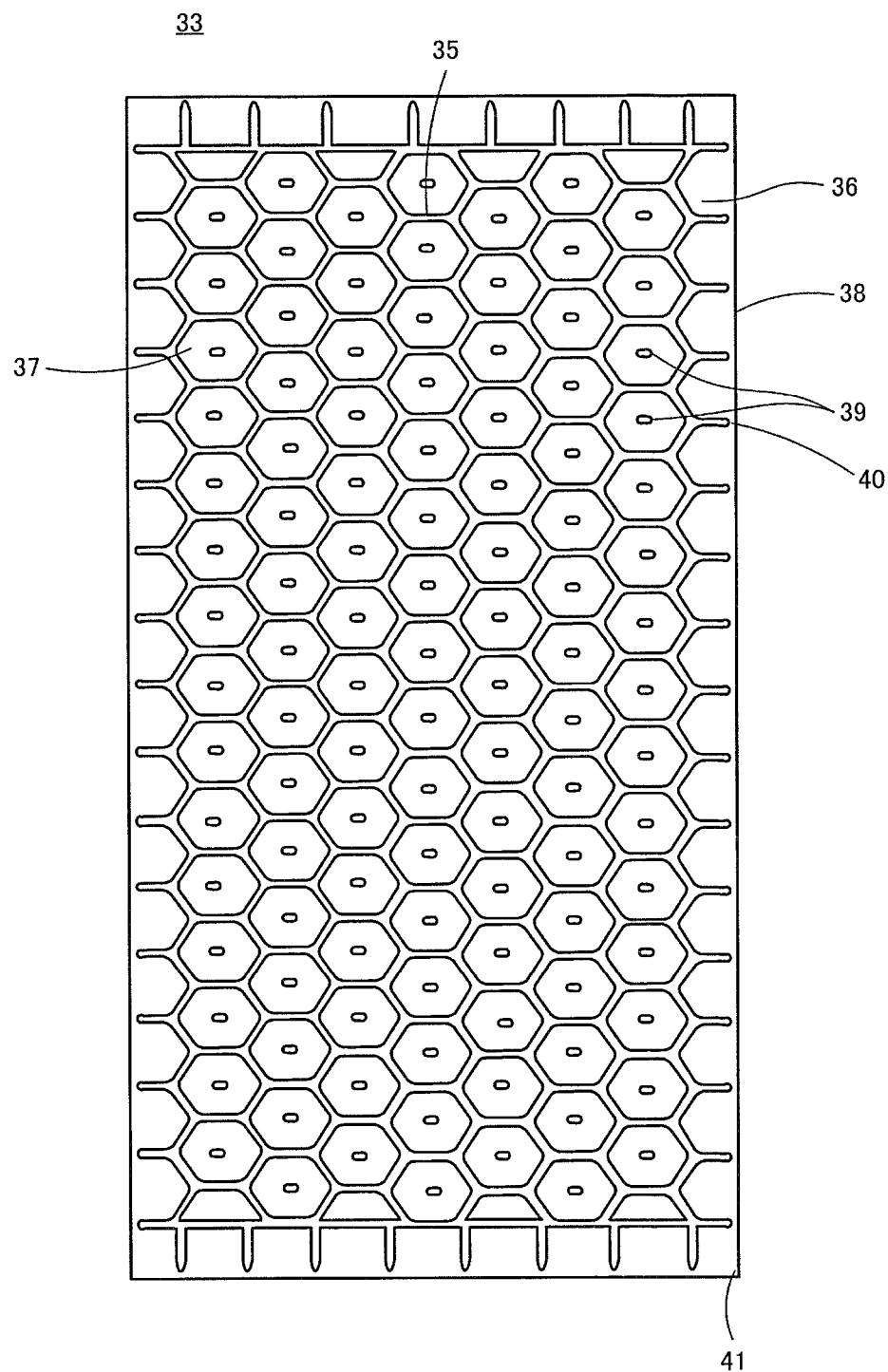
FIG. 4 is a view for explaining the gravure cylinder serving as a gravure printing plate according to a first embodiment of the present disclosure, and is an expanded view of an outer circumferential surface of the gravure cylinder showing an enlargement of a single image section shown in FIG. 3.

FIG. 4 is an expanded view of the circumferential surface of the gravure cylinder 22, illustrating a single image section 33 in an enlarged manner.

Banks 35, as well as a plurality of recess-shaped cells 36 and 37 defined by the banks 35, are provided in the image section 33. Preferably, the mesh size of the cells 36 and 37 is no less than approximately #150 (150 μm), and the depths thereof are no greater than approximately 30 μm. The cells 36 and 37 are divided into edge cells 36 located along an outer edge 38 of the image section 33, and center cells 37 that are the remaining cells. The edge cells 36 and the center cells 37 have substantially polygonal shapes. Specifically, the center cells 37 are substantially hexagonal, whereas the edge cells 36 have approximately half-hexagonal shapes.

A projecting portion 39 is provided in each of the center cells 37 so as to protrude from a part of the base surface of that cell 37. The projecting portions 39 are distanced from the banks 35. Although it is most preferable for each projecting portion 39 to be located in the center of the corresponding cell 37, it is acceptable for each projecting portion 39 to be located within a circle that is centered on the center of the corresponding cell 37 and whose diameter is approximately a half of the maximum linear distance of the cell 37, and more preferable for each projecting portion 39 to be located within a circle whose diameter is approximately one third of the maximum linear distance of the cell 37.

Although the projecting portion 39 is provided for every center cell 37 in FIG. 4, it should be noted that there may be some center cells 37 that are not provided with the projecting portions 39, to the extent that the functionality of the projecting portions 39 is not lost. Meanwhile, projecting portions may be provided in the edge cells 36 as well, as will be described in a later embodiment.

The gravure cylinder 22 provided with the image sections 33 in this manner is manufactured as described hereinafter, for example.

1. A substantially drum-shaped cylinder (gravure cylinder) made of a metal such as a copper tube, an aluminum alloy tube, or the like is prepared.

2. The outer circumferential surface of the cylinder is plated with copper at a thickness of approximately 80 to 100 μm.

3. Part of the outer surface of the copper plating layer on the cylinder is removed in order to form the image sections 33. As a result, the plurality of recess-shaped cells 36 and 37 are formed so as to be defined by the banks 35, and the projecting portions 39 are formed in the center cells 37. Here, a chemical etching technique, for example, can be employed to form the image sections 33. Note, however, that an electronic engraving technique performed by an etching device that uses diamond or a laser may be employed instead of a chemical etching technique.

4. After the image sections 33 have been formed, the surfaces thereof are covered by and reinforced with a thin chrome plating layer.

Next, the configuration of the image section 33 will be described in detail with reference to FIGS. 5 and 6, in addition to FIG. 4.

In this embodiment, the banks 35 that face the outer edge 38 are positioned at a predetermined interval 40 from the outer edge 38, and substantially frame-shaped recess portions that extend continuously along the outer edge 38 are provided in the image section 33. The dimension of the interval 40, or in other words, the width of each substantially frame-shaped recess portion 41, is preferably set to approximately 10 to 30 μm. The presence of the substantially frame-shaped recess portions 41 contributes to an improvement in the linearity of the outer edge 38 of the image section 33, which as a result increases the linearity of a contour of the conductive paste film 29 that is printed.

Although the number of projecting portions 39 is not particularly limited, it is desirable for approximately one to three projecting portions to be in each cell 37. An embodiment in which there are two projecting portions 39 will be described in detail later with reference to the drawings.

In the case where the image section 33 is formed through a chemical etching technique, it is preferable, from the standpoint of the ease of design, for a resist for forming the projecting portions 39 to be designed having a substantially quadrangular shape. However, any desired shape can be selected as long as it is within the aforementioned area range in the post-etching image section 33.

Figure 6:
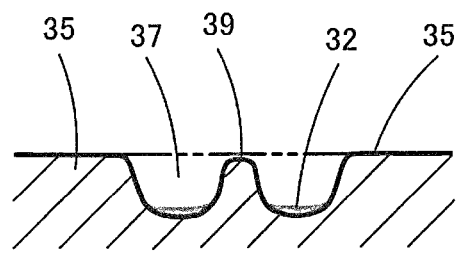
FIG. 6 is a cross-sectional view taken along a VI-VI line shown in FIG. 5, and illustrates a post-transfer state of a conductive paste.

As shown in FIG. 6, upper surfaces of the projecting portions 39 have substantially the same height as upper surfaces of the banks 35 and an outer circumferential surface 43 of the gravure cylinder 22, or may be lower than the outer circumferential surface 43 by approximately 5 μm, for example. As shown in FIG. 1, the gravure cylinder 22 is pressurized by the impression cylinder 24 with the printing target material provided therebetween during printing, and thus the projecting portions 39 can make contact with the printing target material 23 even if the projecting portions 39 are slightly lower. Making the upper surfaces of the projecting portions 39 lower than the outer circumferential surface 43 of the gravure cylinder 22 makes it possible to suppress the doctor blade 34 and the projecting portions 39 from damaging each other when the conductive paste 32 is wiped off by the doctor blade 34.

With both the cells 37 and the projecting portions 39, a dimension measured along the printing direction is different from a dimension measured along a direction orthogonal to the printing direction, and it is preferable for the direction having the longer of these dimensions to be the same in both the cells 37 and the projecting portions 39. To rephrase, it is preferable for the shape of the projecting portions 39 to have a longer dimension along a lengthwise direction of the cells 37.

Although the shape of the cells 37 is not particularly limited, the design thereof is easier with a substantially hexagonal shape, as shown in the drawings, or with a substantially quadrangular shape. In the example shown in the drawings, the edge cells 36 have a substantially half-hexagonal shape.

Although not shown in the drawings, it should be noted that part of each bank 35 positioned between adjacent cells 37 may be cut away so that the adjacent cells 37 communicate with each other. In the case where adjacent cells communicate with each other in this manner, it is preferable for the cells 37 adjacent to each other in the printing direction (that is, the circumferential direction of the gravure cylinder 22) to communicate with each other.

The edge cells 36 are linearly symmetrical relative to an axis of symmetry that follows a direction orthogonal to the outer edge 38. Meanwhile, the center cells 37 are both linearly symmetrical relative to an axis of symmetry that follows a direction orthogonal to the outer edge 38 and linearly symmetrical relative to an axis of symmetry that follows a direction parallel to the outer edge 38.

Each projecting portion 39 is positioned on the stated axes of symmetry of the center cells 37 in which that projecting portion 39 is located. Each of the projecting portions 39 is also linearly symmetrical relative to the stated axes of symmetry. As a result, each projecting portion has at least two axes of symmetry, namely the axis of symmetry that follows the direction orthogonal to the outer edge 38 and the axis of symmetry that follows the direction parallel to the outer edge 38.

Figure 7:
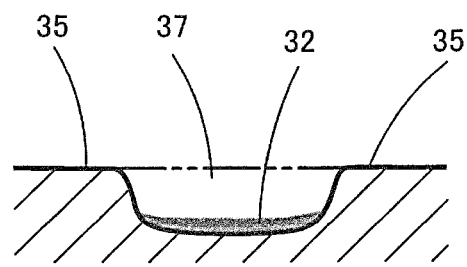
FIG. 7 is a diagram corresponding to FIG. 6, and illustrates, as a comparative example, the post-transfer state of the conductive paste in cells that do not have projecting portions.

The transfer efficiency of the conductive paste 32, which serves as the printing paste, will be described by comparing FIG. 6 and FIG. 7. FIG. 7 corresponds to FIG. 6, but illustrates cells 37 that do not have projecting portions as a comparative example.

With the cells 37 that do not have projecting portions as shown in FIG. 7, a comparatively large amount of the conductive paste 32 remains in the cells 37 after the transfer. As opposed to this, the cells 37 shown in FIG. 6 include the projecting portions 39, and the projecting portions 39 serve as a starting point for the transfer. As a result, the transfer efficiency is increased, and the amount of the conductive paste 32 that remains in the cells 37 after the transfer can be reduced. Therefore, according to the image section 33 including the cells 37 that have the projecting portions 39 as shown in FIG. 6, the conductive paste film 29 that is transferred can be made smooth while also ensuring the required film thickness.

By exploiting these features, adding the projecting portions to a gravure printing plate having an image section already capable of ensuring the desired paste film thickness makes it possible to reduce the depth of the cells, improve productivity by reducing the amount of time required to manufacture the plate, and improve yield by reducing the risk of the banks splitting, and can therefore increase the accuracy of the plate manufacture.

In gravure printing using an intaglio, the conductive paste with which the cells 36 and 37 are filled is transferred onto the ceramic green sheet 28, which serves as the printing target material, via the banks 35 and the outer edge 38. However, as illustrated in FIG. 6 and described earlier, the conductive paste 32 in the cells 36 and 37 is not completely transferred, and some of the conductive paste 32 will remain in the base of the cells 36 and 37.

By providing the projecting portions 39 in the cells 37, the cells 37 can be filled with a slightly lower amount of the conductive paste 32 than in the case where the projecting portions 39 are not provided. However, this also increases the number of locations that can serve as starting points for the transfer, and the conductive paste 32 that would previously remain in the bases of the cells 37 without being transferred can now be transferred via the projecting portions 39, which increases the transfer efficiency.

Repeated experimentation demonstrated that there is a size range for the projecting portions 39 at which the reduction in cell volume and the improvement in the transfer efficiency caused by increasing the starting points for transfer cancel each other out.

This range corresponds to the size of the projecting portion 39 being no greater than approximately 5% of the area of the opening of the cell 37, and the thickness of the conductive paste film 29 that is transferred can be increased if this condition is met.

In actuality, the optimal shape, size, and so on for the projecting portions 39 will vary depending on the size and shape of the cells 36 and 37, the viscosity and rheological characteristics of the printing paste that is used, and so on, but as long as the area of the projecting portion 39 is within approximately 5% of the area of the openings of the cells 37 as described above, essentially the same effects can be expected to be achieved.

Several variations on the image section will be described hereinafter.

Figure 8:
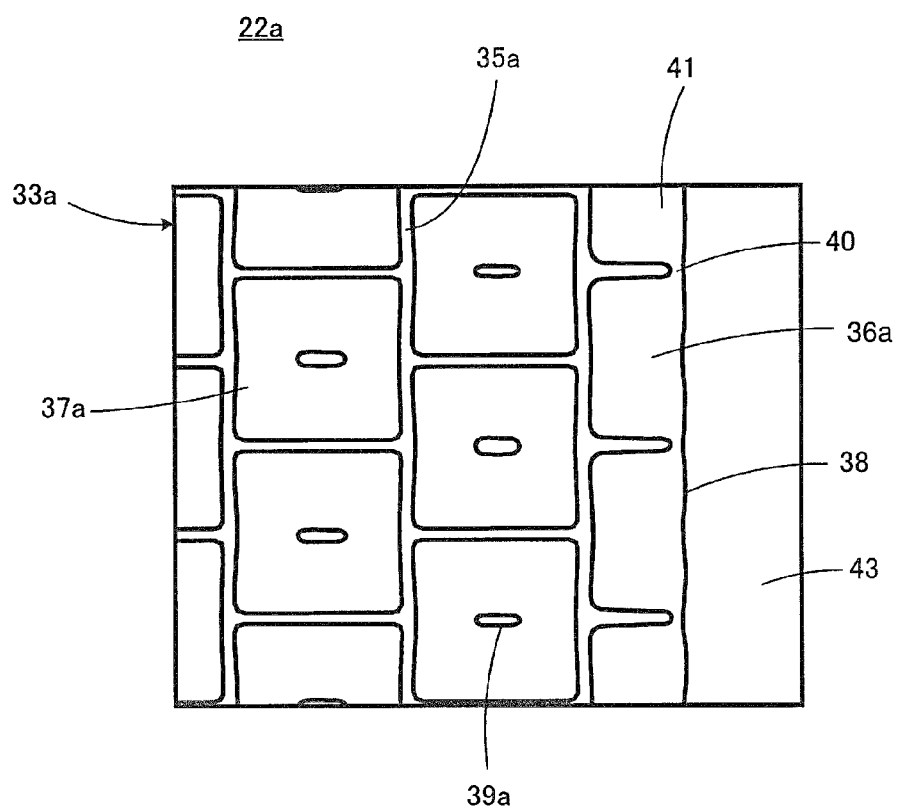
FIG. 8 is a diagram, corresponding to FIG. 5, that illustrates part of an image section provided in a gravure cylinder serving as a gravure printing plate according to a second embodiment of the present disclosure, in an enlarged manner.

FIG. 8 illustrates part of an image section 33a provided in a gravure cylinder 22a according to a second embodiment of the present disclosure in an enlarged manner. Banks 35a, as well as a plurality of cells 36a and 37a defined by the banks 35a, are provided in the image section 33a. FIG. 8, as well as FIGS. 9, 10, and 15 to 17, which will be described later, are diagrams that correspond to FIG. 5. As such, the same reference signs, or reference signs containing common numbers, are given to the elements in those diagrams that correspond to the elements shown in FIG. 5, and redundant descriptions thereof will be omitted.

In FIG. 8, the cells 36a and 37a are substantially quadrangular in shape. Projecting portions 39a are provided in the center cells 37a. Different sizes, shapes, and so on for the cells are used depending on the printing paste that is used, the film thickness that is desired, and so on.

Figure 9:
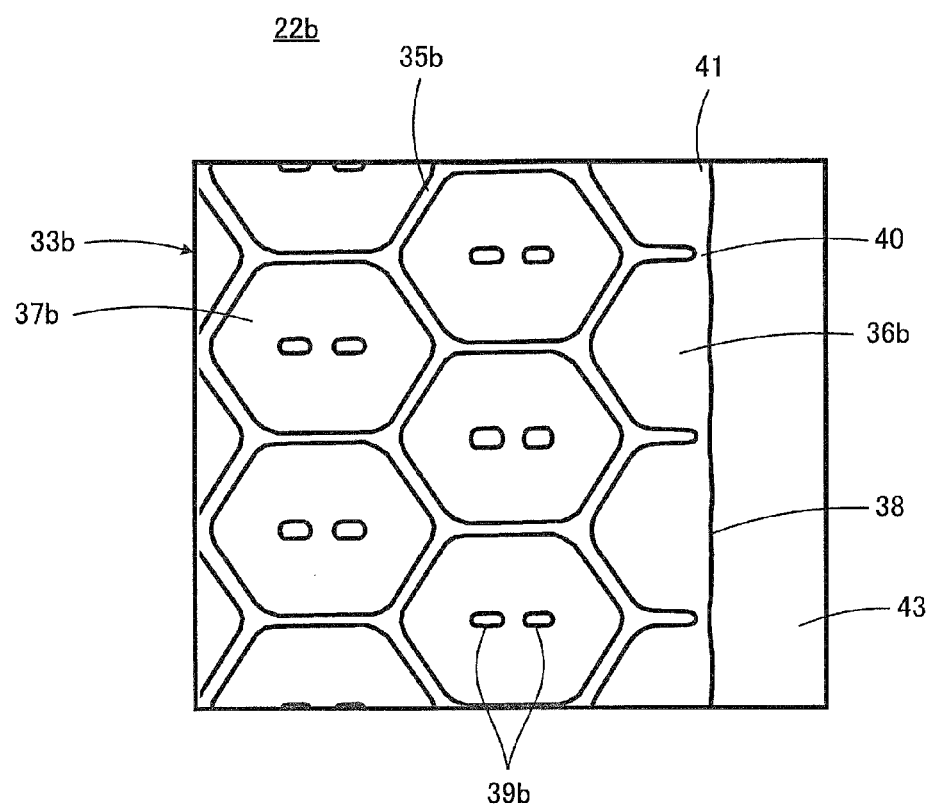
FIG. 9 is a diagram, corresponding to FIG. 5, that illustrates part of an image section provided in a gravure cylinder serving as a gravure printing plate according to a third embodiment of the present disclosure, in an enlarged manner.

FIG. 9 illustrates part of an image section 33b provided in a gravure cylinder 22b according to a third embodiment of the present disclosure in an enlarged manner. Banks 35b, as well as a plurality of cells 36b and 37b defined by the banks 35b, are provided in the image section 33b.

Figure 5:
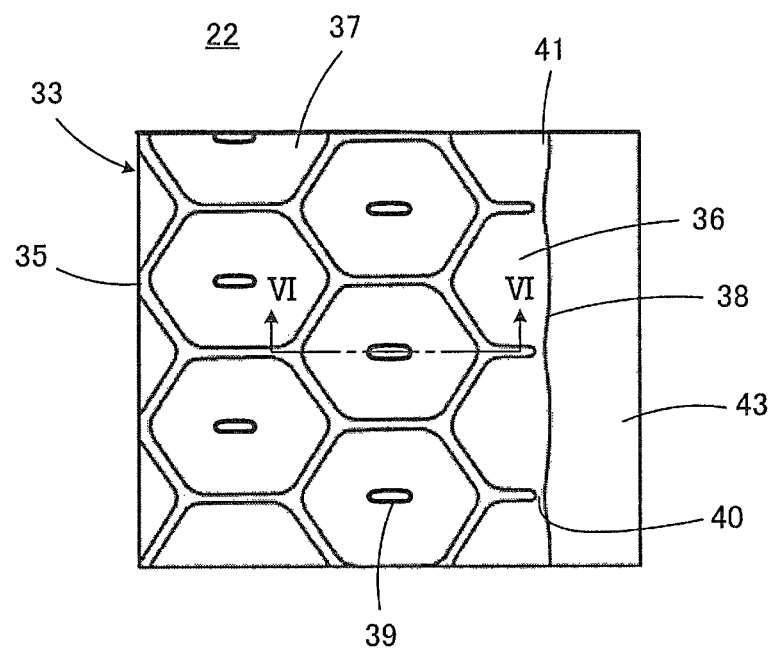
FIG. 5 is a diagram illustrating part of the image section shown in FIG. 4 in a further enlarged manner.

In FIG. 9, the shapes of the cells 36b and 37b are the same as the shapes of the cells 36 and 37 shown in FIG. 5, respectively; however, two projecting portions 39b are provided in each center cell 37b. In this case, a reduction in the amount of printing paste with which each cell 37b is filled can be suppressed by making each projecting portion 39b smaller. Accordingly, this configuration makes it possible to improve the smoothness of the printed conductive paste film further while at the same time ensuring the required film thickness with certainty.

Figure 10:
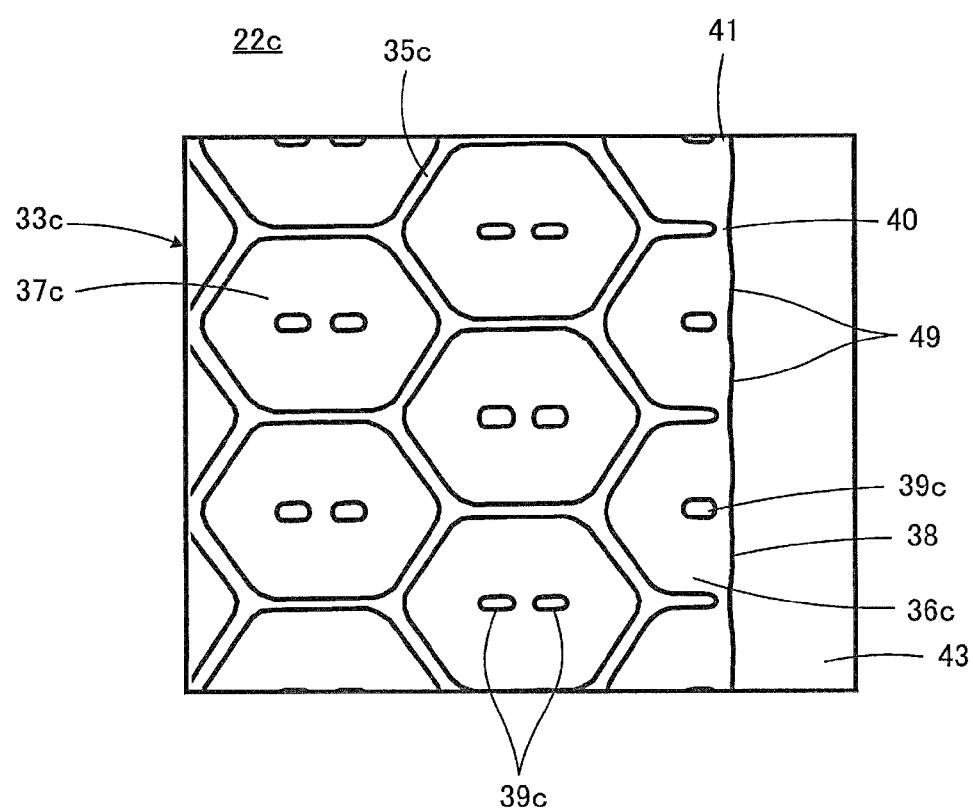
FIG. 10 is a diagram, corresponding to FIG. 5, that illustrates part of an image section provided in a gravure cylinder serving as a gravure printing plate according to a fourth embodiment of the present disclosure, in an enlarged manner.

FIG. 10 illustrates part of an image section 33c provided in a gravure cylinder 22c according to a fourth embodiment of the present disclosure in an enlarged manner. Banks 35c, as well as a plurality of cells 36c and 37c defined by the banks 35c, are provided in the image section 33c.

In FIG. 10, projecting portions 39c are provided in edge cells 36c as well as in center cells 37c. The projecting portions 39c in the edge cells 36c are in positions further toward the outer edge 38 than the centers of the edge cells 36c, but are distanced from the outer edge 38 by the interval 40 in the same manner as the banks 35c. Specifically, the projecting portions 39c in the edge cells 36c are located closer to the edge cells 36c than the closest bank 35c. Because the edge cells 36c are often smaller than the center cells 37c, there tends to be a drop in the thickness of the conductive paste film in the vicinity of the contour thereof, corresponding to the vicinity of the outer edge 38 of the image section 33c. Accordingly, adding the projecting portions 39c in the edge cells 36c as well is useful in reducing variation in the film thickness, improving the smoothness, and so on in the printed conductive paste film as a whole.

Although FIG. 10 illustrates two projecting portions 39c as being provided in each center cell 37c, it should be noted that any number may be used, and a single projecting portion 39c may be provided as well.

Figure 11:
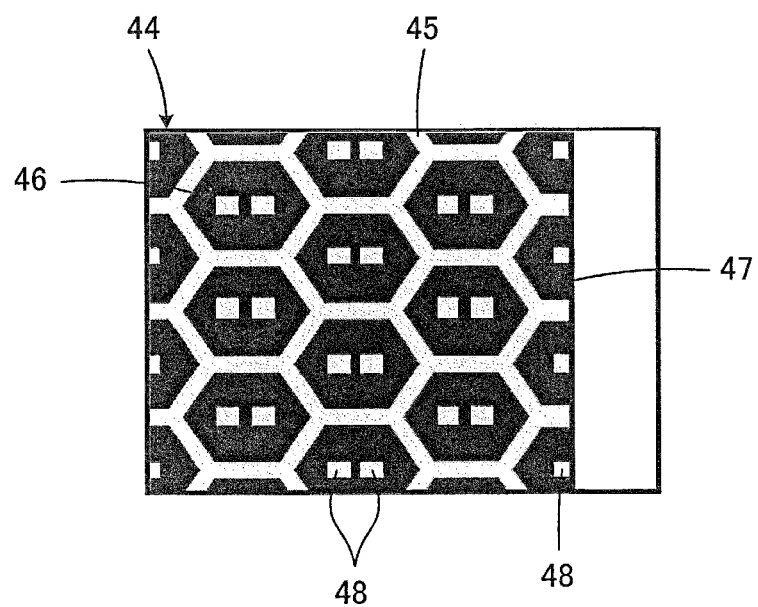
FIG. 11 is a pattern design diagram, corresponding to FIG. 10, illustrating an etching resist provided in order to obtain the image section shown in FIG. 10.

FIG. 11 is a pattern design diagram, corresponding to FIG. 10, illustrating an etching resist 44 provided in order to obtain the image section 33c shown in FIG. 10.

In FIG. 11, a portion 45 that corresponds to the bank 35c indicates a portion where the etching resist 44 is present, and is indicated as a blank area. An open portion 46 in the etching resist 44 that corresponds to the center cell 37c is substantially hexagonal in shape, whereas an open portion 47 that corresponds to the edge cell 36c has a substantially half-hexagonal shape. Meanwhile, the etching resist 44 is also present at portions 48, which correspond to the projecting portions 39c and are located within each open portion 47 that corresponds to the edge cell 36c.

When chemical etching is carried out using the etching resist 44 as described earlier, the copper plate layer on the outer circumferential surface of the gravure cylinder 22c is bit not only in the thickness direction, but also in a main surface direction. As a result, the banks 35c and the projecting portions 39c are thinner and have more rounded corners than the corresponding portions 45 and 48 in the etching resist 44, as shown in FIG. 10.

Meanwhile, it is easy for etchant to accumulate in the vicinity of each bank 35c and projecting portion 39c at the outer edge 38 of the image section 33c, which slows the progress of the etching; on the other hand, the etchant flows better further from the banks 35c and the projecting portions 39c, which accelerates the progress of the etching. As a result, as shown in FIG. 10, at the outer edge 38 of the image section 33c, a portion between the bank 35c and the projecting portion 39c is bit so as to curve slightly outward, forming two arch portions 49, which curve outward, in areas corresponding to locations in the outer edge 38 between leading ends of adjacent banks 35c.

The phenomena caused by chemical etching described thus far are the same in the other embodiments as well, although no particular descriptions thereof will be given.

Next, a method for designing the etching resist 44 illustrated in FIG. 11 will be described.

Figure 12:
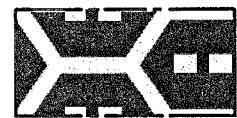
FIG. 12 is a diagram illustrating a unit shape in the pattern of the etching resist shown in FIG. 11.

The pattern of the etching resist 44 shown in FIG. 11 is drawn by a design tool such as typical image editing software. To design the pattern shown in FIG. 11, first, a unit shape, such as that shown in FIG. 12, is created. This unit shape is then duplicated in the horizontal and vertical directions using the design tool, creating a pattern such as that shown in FIG. 13. In the pattern shown in FIG. 13, the portions corresponding to the projecting portions are arranged along the lengthwise direction of the hexagons that will serve as the portions corresponding to the banks, near the centers of the hexagons.

Figure 13:
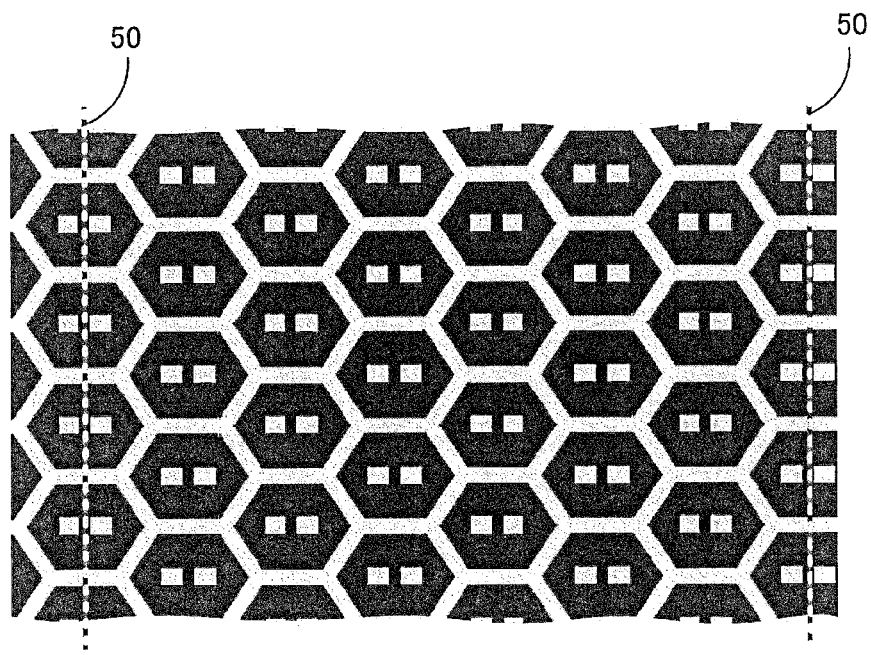
FIG. 13 is a pattern diagram obtained by duplicating the unit shape shown in FIG. 12.

Next, extra portions of the pattern shown in FIG. 13 are removed based on the size of the image section 33c. In FIG. 13, locations that are to be cut when removing these extra portions are indicated by broken lines 50. The positions of the broken lines 50 correspond to the positions of the outer edges 38 of the image section 33c, and the broken lines 50 are positioned upon an axis of symmetry of the hexagons, in positions that pass between the two adjacent projecting portions 39c.

Figure 14:
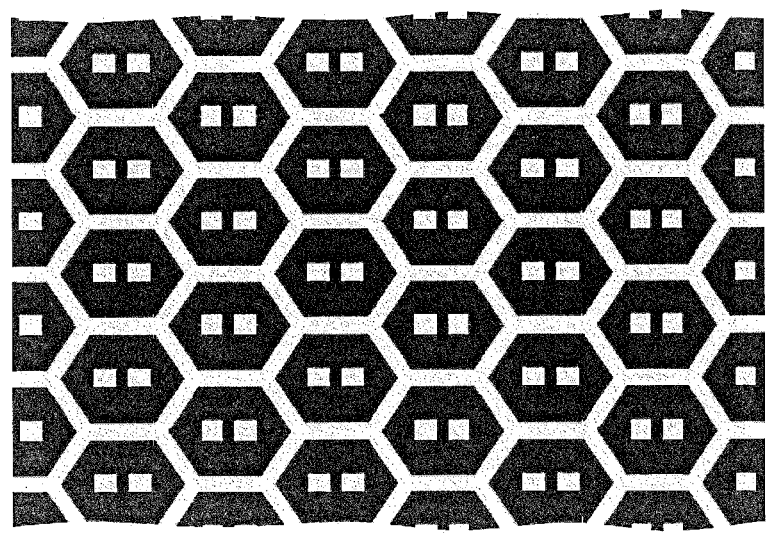
FIG. 14 is a pattern design diagram illustrating the etching resist obtained from the pattern diagram illustrated in FIG. 13.

FIG. 14 is a pattern design diagram illustrating the etching resist 44 obtained from the pattern diagram illustrated in FIG. 13. Note that the aforementioned FIG. 11 illustrates part of FIG. 14. As described earlier, the broken lines 50 are in positions that pass between the two adjacent projecting portions 39c, and thus when the pattern is cut along the broken lines 50, the projecting portions 39c in the edge cells 36c are automatically located closer to the outer edge 38 than the centers of those edge cells 36c in the image section 33c obtained from this etching resist 44, as described earlier. As such, the aforementioned method makes it easy to design the etching resist 44.

Figure 15:
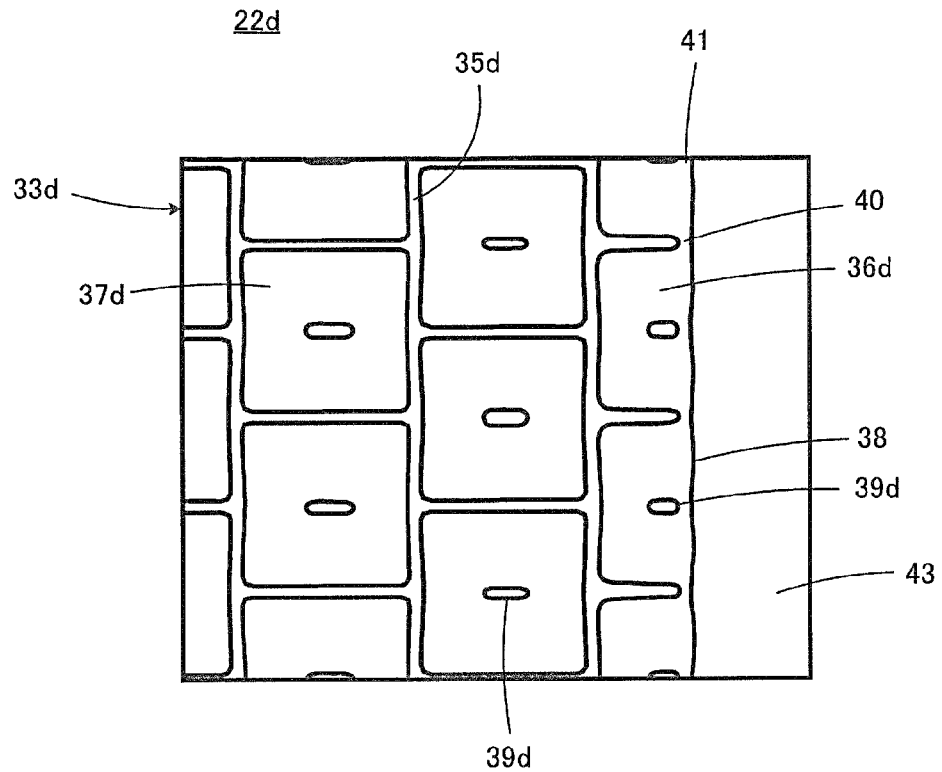
FIG. 15 is a diagram, corresponding to FIG. 5, that illustrates part of an image section provided in a gravure cylinder serving as a gravure printing plate according to a fifth embodiment of the present disclosure, in an enlarged manner.

FIG. 15 illustrates part of an image section 33d provided in a gravure cylinder 22d according to a fifth embodiment of the present disclosure in an enlarged manner. Banks 35d, as well as a plurality of cells 36d and 37d defined by the banks 35d, are provided in the image section 33d.

Compared to the second embodiment illustrated in FIG. 8, the projecting portions 39d shown in FIG. 15 are provided in the edge cells 36d as well as in the center cells 37d. The projecting portions 39d in the edge cells 36d are located closer to the outer edge 38 than the centers of the edge cells 36d. According to this embodiment, the projecting portions 39d are present in the edge cells 36d, and thus variation in the film thickness can be reduced, the smoothness can be improved, and so on in the printed conductive paste film as a whole, in the same manner as in the fourth embodiment illustrated in FIG. 10.

Figure 16:
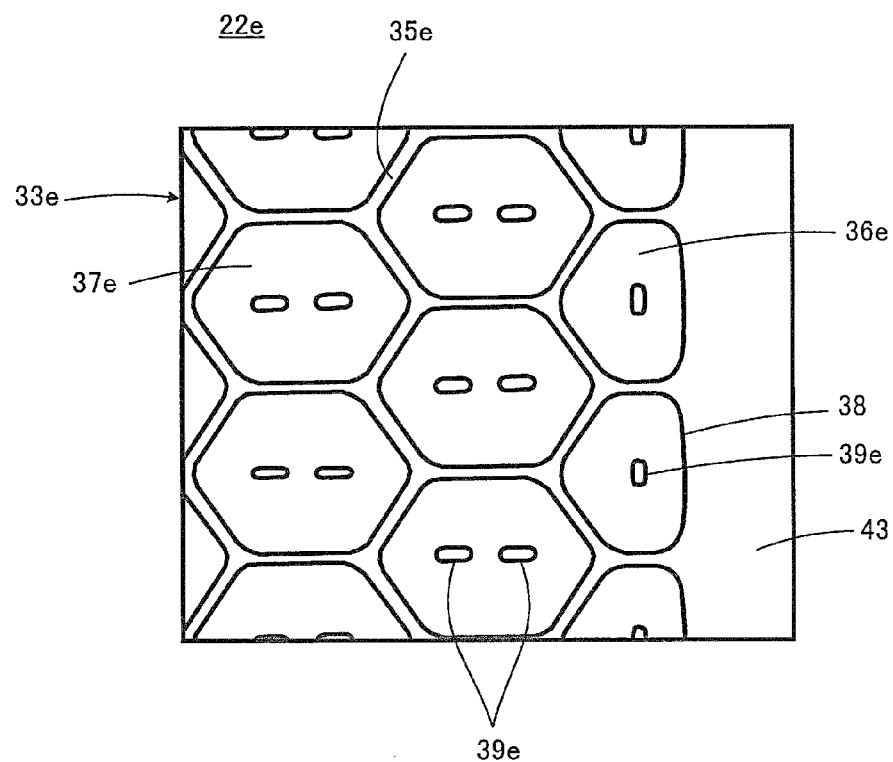
FIG. 16 is a diagram, corresponding to FIG. 5, that illustrates part of an image section provided in a gravure cylinder serving as a gravure printing plate according to a sixth embodiment of the present disclosure, in an enlarged manner.

FIG. 16 illustrates part of an image section 33e provided in a gravure cylinder 22e according to a sixth embodiment of the present disclosure in an enlarged manner. Banks 35e, as well as a plurality of cells 36e and 37e defined by the banks 35e, are provided in the image section 33e.

In FIG. 16, the banks 35e are positioned so as to make contact with the outer edge 38 of the image section 33e. Accordingly, the substantially frame-shaped recess portions that extend continuously along the outer edge 38, which are provided in the aforementioned embodiments, are not provided here.

Furthermore, in FIG. 16, projecting portions 39e are provided in the edge cells 36e as well. The edge cells 36e have long, flat shapes along the outer edge 38. Accordingly, it is preferable for the projecting portions 39e in the edge cells 36e to be disposed so as to have a lengthwise direction along the same direction as the lengthwise direction of the edge cells 36e.

Figure 17:
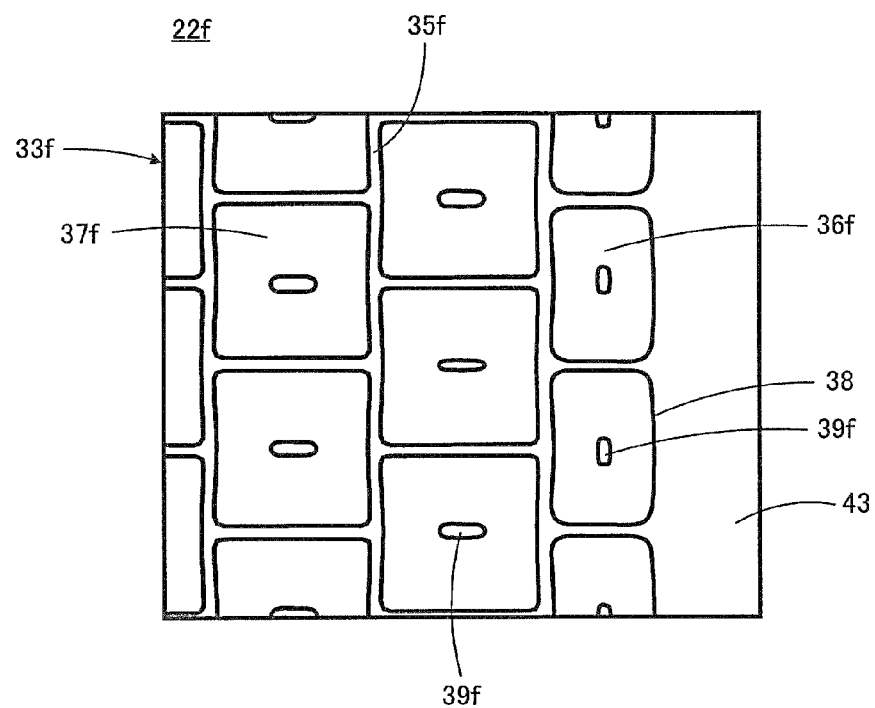
FIG. 17 is a diagram, corresponding to FIG. 5, that illustrates part of an image section provided in a gravure cylinder serving as a gravure printing plate according to a seventh embodiment of the present disclosure, in an enlarged manner.
Figure 18:
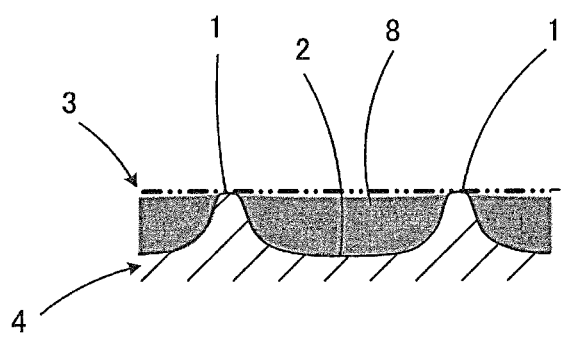
FIG. 18 is a cross-sectional view illustrating the behavior of a printing paste with which cells are filled when the printing paste is transferred onto a printing target material during conventional gravure printing related to the present disclosure, and illustrates a state in which cells have been filled with a conductive paste serving as the printing paste.
Figure 19:
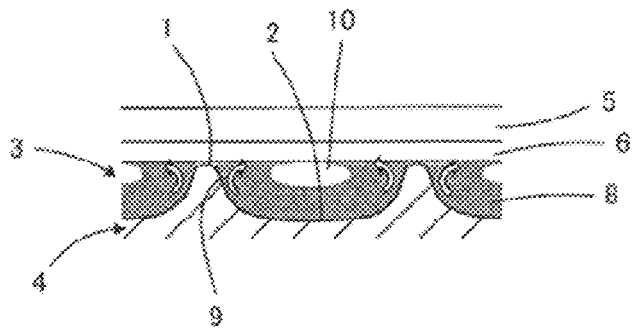
FIG. 19 is a cross-sectional view illustrating a state in which a ceramic green sheet has made contact with an image section of a gravure printing plate following the state shown in FIG. 18.
Figure 20:
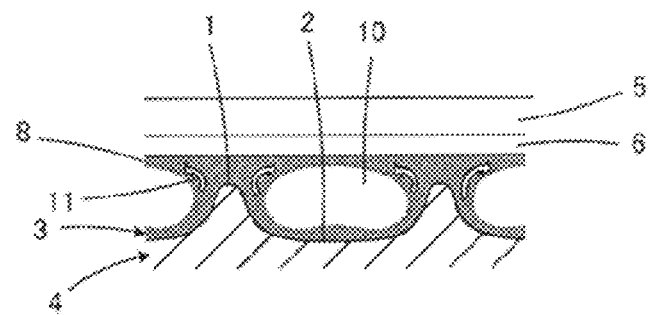
FIG. 20 is a cross-sectional view illustrating a state in which the ceramic green sheet begins to separate from the gravure printing plate following the state shown in FIG. 19.
Figure 21:
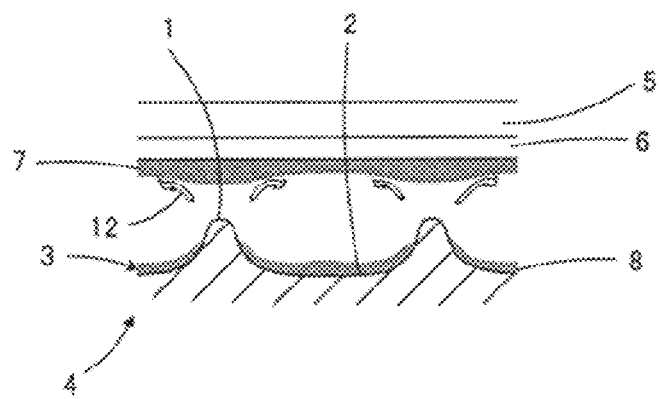
FIG. 21 is a cross-sectional view illustrating a state in which the ceramic green sheet has further separated from the gravure printing plate, and the transfer of the conductive paste has ended, following the state shown in FIG. 20.

FIG. 17 illustrates part of an image section 33f provided in a gravure cylinder 22f according to a seventh embodiment of the present disclosure in an enlarged manner. Banks 35f, as well as a plurality of cells 36f and 37f defined by the banks 35f, are provided in the image section 33f.

In FIG. 17, the cells 36f and 37f are substantially quadrangular in shape. Furthermore, the banks 35f are positioned so as to make contact with the outer edge 38 of the image section 33f, in the same manner as the embodiment illustrated in FIG. 16. Projecting portions 39f are provided in both the edge cells 36f and the center cells 37f. The projecting portions 39f in the edge cells 36f are disposed so as to have a lengthwise direction along the same direction as the lengthwise direction of the cells 36f.

While the disclosure has been described thus far with reference to embodiments illustrated in the drawings, it should be noted that many variations can be made thereon without departing from the scope of the disclosure.

For example, although the image sections 33 and so on are illustrated and described in the embodiments as being substantially rectangular in shape, the shape of the image sections can be altered as desired in accordance with the pattern of the conductive paste film 29 to be formed through the gravure printing.

Furthermore, although the embodiments illustrate and describe the printing target material 23 as being the ceramic green sheet 28 backed by the carrier film 30, with the conductive paste film 29 being formed on the ceramic green sheet 28, a resin sheet such as the carrier film 30 may be used alone as the printing target material 23 and the conductive paste film 29 may be formed on that resin sheet, for example. In this case, the conductive paste film 29 formed on the resin sheet is transferred onto the ceramic green sheet 28 in a subsequent process.

Furthermore, although the embodiments illustrate and describe a paste film formed through gravure printing as the conductive paste film 29, the film may be configured of a paste-form entity such as a ceramic slurry, for example. More specifically, in laminated ceramic capacitors, for example, a ceramic layer for eliminating non-planarities with the thicknesses of internal electrodes is sometimes formed in regions where the internal electrodes are not formed in order to eliminate those non-planarities, and the present disclosure can also be applied in cases where a paste film, configured of a ceramic slurry, that is to serve as such a ceramic layer is formed.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A gravure printing plate used for transferring a paste film onto a printing target material through gravure printing, the plate comprising:
   an image section to which a printing paste for forming the paste film is supplied,
   wherein the image section is provided with banks, a plurality of substantially recess-shaped cells defined by the banks, and projecting portions that project from a part of a bottom surface of each cell inside of the cell and that are separated from the banks;
   wherein the plurality of cells are edge cells located along an outer edge of the image section and center cells that are the remaining cells;
   wherein the projecting portions are located in the edge cells and the center cells; and wherein the projecting portions located in the edge cells are each positioned closer to the outer edge than to the nearest bank.

2. A manufacturing method for a laminated ceramic electronic component, the method using a conductive paste as the printing paste and comprising the steps of:
    forming, as a paste film, a conductive paste film that is to serve as an internal electrode, on a ceramic green sheet that serves as a printing target portion while using a gravure printing machine including the gravure printing plate according to claim 1; and
    creating a multilayer body by stacking a plurality of the ceramic green sheets on which the conductive paste film has been formed.

3. The manufacturing method for a laminated ceramic electronic component according to claim 2,
    wherein a planar cross-section of at least one of the projecting portions has an elongated shape, and
    wherein the planar cross-section comprises a curved surface.

4. The manufacturing method for a laminated ceramic electronic component according to claim 3,
    wherein the plurality of cells are edge cells located along an outer edge of the image section and center cells that are the remaining cells, and
    wherein a shape of at least one of the edge cells comprises an incomplete portion of a shape of one of the center cells.

5. A gravure printing plate used for transferring a paste film onto a printing target material through gravure printing, the plate comprising:
    an image section to which a printing paste for forming the paste film is supplied,
    wherein the image section is provided with banks, a plurality of substantially recess-shaped cells defined by the banks, and projecting portions that project from a part of a bottom surface of each cell inside of the cell and that are separated from the banks; and
    wherein two or more projecting portions are provided in each cell.

6. A manufacturing method for a laminated ceramic electronic component, the method using a conductive paste as the printing paste and comprising the steps of:
    forming, as a paste film, a conductive paste film that is to serve as an internal electrode, on a ceramic green sheet that serves as a printing target portion while using a gravure printing machine including the gravure printing plate according to claim 5; and
    creating a multilayer body by stacking a plurality of the ceramic green sheets on which the conductive paste film has been formed.

7. The manufacturing method for a laminated ceramic electronic component according to claim 6,
    wherein a planar cross-section of at least one of the projecting portions has an elongated shape, and
    wherein the planar cross-section comprises a curved surface.

8. The manufacturing method for a laminated ceramic electronic component according to claim 7,
    wherein the plurality of cells are edge cells located along an outer edge of the image section and center cells that are the remaining cells, and
    wherein a shape of at least one of the edge cells comprises an incomplete portion of a shape of one of the center cells.

* * * * *